(12) United States Patent (10) Patent No.: US 9,203,052 B2
Lee et al. (45) Date of Patent: Dec. 1, 2015

(54) ORGANIC LIGHT EMITTING DIODE DISPLAY AND METHOD OF MANUFACTURING THE SAME

(75) Inventors: Sung-Hun Lee, Yongin (KR); Gwan-Hyoung Lee, Yongin (KR); Chang-Woong Chu, Yongin (KR); Young-Gu Ju, Daegu-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 112 days.

(21) Appl. No.: 12/946,771

(22) Filed: Nov. 15, 2010

(65) Prior Publication Data

US 2011/0114931 A1 May 19, 2011

(30) Foreign Application Priority Data

Nov. 18, 2009 (KR) .................. 10-2009-0111630

(51) Int. Cl.
*H01L 51/52* (2006.01)

(52) U.S. Cl.
CPC ........ *H01L 51/5262* (2013.01); *H01L 51/5268* (2013.01); *H01L 2251/5369* (2013.01)

(58) Field of Classification Search
CPC .................................................. H01L 51/5262
USPC .................. 438/29, 98; 257/98, E33.073, 40, 257/E51.018
See application file for complete search history.

(56) References Cited

U.S. PATENT DOCUMENTS

| | | | | |
|---|---|---|---|---|
| 5,100,478 A * | 3/1992 | Kawabata | ...................... | 136/249 |
| 6,091,195 A * | 7/2000 | Forrest et al. | .................. | 313/504 |
| 6,638,601 B1 * | 10/2003 | Follensbee | ................... | 428/143 |
| 6,833,667 B2 * | 12/2004 | Hamano et al. | ................ | 313/504 |
| 6,900,457 B2 * | 5/2005 | Toguchi et al. | .................. | 257/40 |
| 7,342,246 B2 * | 3/2008 | Sugiura et al. | .................. | 257/40 |
| 7,473,932 B2 * | 1/2009 | Cho et al. | ......................... | 257/88 |
| 7,501,665 B2 * | 3/2009 | Yasuda et al. | .................... | 257/98 |
| 7,916,254 B2 * | 3/2011 | Matsumori et al. | ........... | 349/123 |

(Continued)

FOREIGN PATENT DOCUMENTS

| | | |
|---|---|---|
| CN | 101034879 A | 9/2007 |
| EP | 1 603 367 A1 | 12/2005 |

(Continued)

OTHER PUBLICATIONS

Korean Office Action dated Apr. 27, 2011 for Korean Patent Application No. KR 10-2009-0111630 which corresponds to the captioned U.S. Appl. No. 12/946,771.

(Continued)

*Primary Examiner* — Yu-Hsi D Sun
*Assistant Examiner* — Ankush Singal
(74) *Attorney, Agent, or Firm* — Knobbe, Martens, Olson & Bear (57) ABSTRACT

An organic light emitting diode (OLED) device is disclosed. In one embodiment, the OLED device includes: i) a substrate and ii) a first thin film formed on the substrate, wherein the first thin film comprises first and second surfaces opposing each other, wherein the first surface contacts the substrate, and wherein a plurality of protrusions and depressions are alternately formed on the second surface of the first thin film. The OLED device may further include a second thin film formed on the protrusions and depressions of the first thin film, a first electrode formed on the second thin film, a light emitting member formed on the first electrode and a second electrode formed on the organic light emitting member.

18 Claims, 4 Drawing Sheets

(56) References Cited

U.S. PATENT DOCUMENTS

| | | | |
|---|---|---|---|
| 2002/0197875 A1* | 12/2002 | Lin et al. ............... | 438/701 |
| 2003/0117067 A1* | 6/2003 | Roitman et al. ............ | 313/504 |
| 2004/0241924 A1* | 12/2004 | Chen et al. ............... | 438/197 |
| 2005/0000564 A1* | 1/2005 | Sato et al. ............... | 136/256 |
| 2005/0007000 A1 | 1/2005 | Chou et al. | |
| 2005/0082562 A1* | 4/2005 | Ou et al. ............... | 257/103 |
| 2005/0161693 A1* | 7/2005 | Sugiura et al. ............ | 257/98 |
| 2006/0054907 A1* | 3/2006 | Lai ............... | 257/96 |
| 2006/0071233 A1* | 4/2006 | Cho et al. ............... | 257/103 |
| 2006/0175961 A1* | 8/2006 | Choong ............... | 313/506 |
| 2007/0210676 A1* | 9/2007 | Matsuda et al. ............ | 310/326 |
| 2007/0257608 A1* | 11/2007 | Tyan et al. ............... | 313/506 |
| 2007/0290607 A1* | 12/2007 | Okada et al. ............ | 313/504 |
| 2008/0012005 A1* | 1/2008 | Yang et al. ............... | 257/40 |
| 2008/0067929 A1* | 3/2008 | Kuo ............... | 313/506 |
| 2008/0218076 A1* | 9/2008 | Kabay et al. ............ | 313/509 |
| 2009/0015142 A1* | 1/2009 | Potts et al. ............... | 313/504 |
| 2009/0211783 A1* | 8/2009 | Tsutsumi et al. ............ | 174/126.1 |
| 2009/0236962 A1* | 9/2009 | Fujimoto et al. ............ | 313/348 |
| 2010/0019235 A1* | 1/2010 | Iizumi et al. ............... | 257/40 |
| 2010/0059365 A1 | 3/2010 | Valentin et al. | |
| 2011/0006337 A1* | 1/2011 | Kim et al. ............... | 257/103 |
| 2011/0042695 A1* | 2/2011 | Oyamada ............... | 257/88 |
| 2011/0076456 A1* | 3/2011 | Wang ............... | 428/164 |
| 2011/0114921 A1* | 5/2011 | Yang et al. ............... | 257/40 |
| 2011/0316036 A1* | 12/2011 | Furukawa ............... | 257/99 |

FOREIGN PATENT DOCUMENTS

| | | |
|---|---|---|
| JP | 2003-218383 | 7/2003 |
| JP | 2003-340289 | 12/2003 |
| JP | 2005-183905 A | 7/2005 |
| JP | 2009-037810 | 2/2009 |
| KR | 10-2004-0061798 | 7/2004 |
| KR | 10-2007-0076738 A | 7/2007 |
| KR | 10-2007-0102947 A | 10/2007 |
| TW | I278250 (B) | 4/2007 |
| TW | 200902466 (A) | 1/2009 |
| TW | 200913767 (A) | 3/2009 |
| WO | WO 2009/063954 A1 | 5/2009 |

OTHER PUBLICATIONS

Chiu et al., Efficiency enhancement of UV/blue light emitting diodes via nanoscaled epitaxial lateral overgrowth of GaN on a $SiO_2$ nanorod-array patterned sapphire substrate, Journal of Crystal Growth, 310, (2008) 5170-5174.

Saxena et al., A review on the light extraction techniques in organic electroluminescent devices, Optical Materials, 32, (2009) 221-233.

Wang et al., A nano-patterned organic light-emitting diode with high extraction efficiency, Journal of Crystal Growth, 288, (2006) 119-122.

Extended European Search Report dated Jan. 20, 2011 for European Patent Application No. EP 10 19 1279.8 related to the captioned application.

Nakanishi, Tsutomu et al., "Improvement of the light extraction efficiency of top-emitting organic light-emitting diodes by a two-dimensional diffraction layer fabricated using self-assembled nanoparticles," *Applied Optics*, vol. 48, No. 31, Nov. 1, 2009, pp. 5889-5896.

Wang, Jinsong et al., "Nanostructure Fabrication using Nanosphere Lithography for Photonics Devices," *Technical Digest CD-ROM/Conference on Lasers and Electro-Optics, Quantum Electronics and Laser Science Conference, Conference on Photonic Applications, Systems and Technologies*: Long Beach Convention Center, Long, Beach, CA, USA: CLEO/QELS, May 21, 2006, pp. 1-2.

European Examination Report dated Mar. 14, 2013 for European Patent Application No. EP 10 191 279.8 which shares priority of Korean Patent Application No. KR 10-2009-0111630 with captioned U.S. Appl. No. 12/946,771.

* cited by examiner

ORGANIC LIGHT EMITTING DIODE DISPLAY AND METHOD OF MANUFACTURING THE SAME

RELATED APPLICATIONS

This application claims priority to and the benefit of Korean Patent Application No. 10-2009-0111630 filed in the Korean Intellectual Property Office on Nov. 18, 2009, the entire contents of which are incorporated herein by reference.

BACKGROUND

1. Field

This disclosure relates to an organic light emitting diode (OLED) device and a method of manufacturing the same.

2. Description of the Related Technology

An organic light emitting diode (OLED) device emits light when electrons injected from one electrode are combined with holes injected from another electrode in an emission layer between the electrodes and generates an exciton, which releases energy. Since the OLED device is self-emissive, it has very low power consumption.

SUMMARY OF CERTAIN INVENTIVE ASPECTS

One aspect is an organic light emitting diode (OLED) device capable of improving luminous efficiency. Another aspect is a method of manufacturing an OLED device that increases luminous efficiency and simultaneously is applied to a large size OLED device.

Another aspect is an OLED device that includes a substrate; a first thin film formed on the substrate and having protrusions and depressions at the surface; a second thin film formed on the first thin film and planarizing the protrusions and depressions; a first electrode formed on the second thin film; a light emitting member formed on the first electrode; and a second electrode formed on the first electrode.

The first thin film and the second thin film may include materials having refractive index different from each other. The first thin film and the second thin film may have refractive index of about 1.1 to 3, respectively. The refractive index difference between the first thin film and the second thin film may be at least 0.2.

The refractive index of the first thin film may range from about 1.6 to 2.2; and the refractive index of the second thin film may range from about 1.3 to 1.6. According to one embodiment, the refractive index of the first thin film may range from about 1.3 to 1.6; and the refractive index of the second thin film may range from about 1.6 to 2.2.

The first thin film may include silicon oxide, silicon nitride, polyacryl, polyimide, or a combination thereof; the second thin film may include silicon nitride, aluminum oxide, or a combination thereof. The protrusions and depressions may be irregularly distributed.

Another aspect is a method of manufacturing an OLED device that includes providing a first thin film having protrusions and depressions on a substrate; providing a second thin film planarizing the protrusions and depressions on the first thin film; providing a first electrode on the second thin film; providing a light emitting member on the first electrode; and providing a second electrode on the light emitting member.

The providing a first thin film having protrusions and depressions may include forming a first thin film; coating a dispersing solution including an organic particulate having a first size on the first thin film; drying the dispersing solution; etching the organic particulate to provide an organic particulate having a second size smaller than the first size; and etching the first thin film using the organic particulate having the second size as a mask.

The organic particulate may have a sphere shape. The organic particulate may include polystyrene. The etching an organic particulate may use plasma. The etching a first thin film may be performed by reactive ion etching.

The providing a first thin film having protrusions and depressions may include forming a first thin film including an organic material and treating the surface of first thin film with plasma. The manufacturing method may further include applying a metal cluster on the first thin film after forming the first thin film; and the treating the surface of first thin film with plasma may be performed by using the metal cluster as a mask.

Another aspect is an organic light emitting diode (OLED) device comprising: a substrate; a first thin film formed on the substrate, wherein the first thin film comprises first and second surfaces opposing each other, wherein the first surface contacts the substrate, and wherein a plurality of protrusions and depressions are alternately formed on the second surface of the first thin film; a second thin film formed on the protrusions and depressions of the first thin film; a first electrode formed on the second thin film; a light emitting member formed on the first electrode; and a second electrode formed on the organic light emitting member.

In the above OLED device, the first thin film and the second thin film have different refractive indexes. In the above OLED device, each of the first thin film and the second thin film has a refractive index of about 1.1 to about 3. In the above OLED device, the refractive indexes of the first thin film and second thin film differ by at least about 0.2. In the above OLED device, the first thin film has a refractive index of about 1.6 to about 2.2, and wherein the second thin film has a refractive index of about 1.3 to about 1.6. In the above OLED device, the first thin film has a refractive index of about 1.3 to about 1.6, and wherein the second thin film has a refractive index of about 1.6 to about 2.2. In the above OLED device, the first thin film is formed of silicon oxide, silicon nitride, polyacryl, polyimide, or a combination thereof, and wherein the second thin film is formed of silicon nitride, aluminum oxide, or a combination thereof. In the above OLED device, the protrusions and depressions are irregularly distributed.

Another aspect is a method of manufacturing an organic light emitting diode (OLED) device comprising: providing a first thin film on a substrate, wherein the first thin film comprises first and second surfaces opposing each other, wherein the first surface contacts the substrate, and wherein the second surface of the first thin film has a plurality of protrusions and depressions which are alternately formed with respect to each other; providing a second thin film on the second surface of the first thin film so as to planarize the protrusions and depressions; providing a first electrode on the second thin film; providing a light emitting member on the first electrode; and providing a second electrode on the light emitting member.

In the above method, the providing of the first thin film comprises: forming the first thin film; coating a dispersing solution on the first thin film, wherein the dispersing solution contains a plurality of first organic particles at least one of which has a first size; drying the dispersing solution; etching the first organic particles into a plurality of second organic particles at least one of which has a second size smaller than the first size; and etching the first thin film with the use of the second organic particles as a mask.

In the above method, the first and second organic particles have a sphere shape. In the above method, the first and second organic particles contain polystyrene. In the above method, the etching of the first organic particles is performed by plasma. In the above method, the etching of the first thin film is performed by reactive ion etching. In the above method, the providing of the first thin film comprises: forming a first thin film containing an organic material; and treating the surface of the first thin film with plasma. The above method further comprises applying a metal cluster on the first thin film after laminating the first thin film; and wherein the plasma treating of the surface of the first thin film is performed with the use of the metal cluster as a mask.

Another aspect is an organic light emitting diode (OLED) device comprising: a substrate; a first layer formed on the substrate, wherein the first layer comprises first and second surfaces opposing each other, wherein the first surface contacts the substrate, and wherein the second surface of the first layer has a plurality of convex and concave portions which are alternately formed with respect to each other; a second layer formed on the convex and concave portions of the first layer; and an organic light emitting diode formed on the second layer.

In the above OLED device, the first and second layers have different refractive indexes. In the above OLED device, at least two of the convex and concave portions are not uniformly formed with respect to the remaining convex and concave portions. In the above OLED device, the first layer is formed of silicon oxide, silicon nitride, polyacryl, polyimide, or a combination thereof, and wherein the second layer is formed of silicon nitride, aluminum oxide, or a combination thereof.

DETAILED DESCRIPTION OF CERTAIN INVENTIVE ASPECTS

In order to further reduce the power consumption, it is important to increase the luminous efficiency of an organic light emitting diode (OLED) device. The luminous efficiency may be determined by the internal quantum efficiency which is a ratio of the charge number injected from electrode to the quantum number generated from emission layer and the external quantum efficiency which is a ratio of quantum number generated from emission layer to quantum number emitted to the outside.

This disclosure will be described more fully hereinafter with reference to the accompanying drawings, in which exemplary embodiments of this disclosure are shown. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
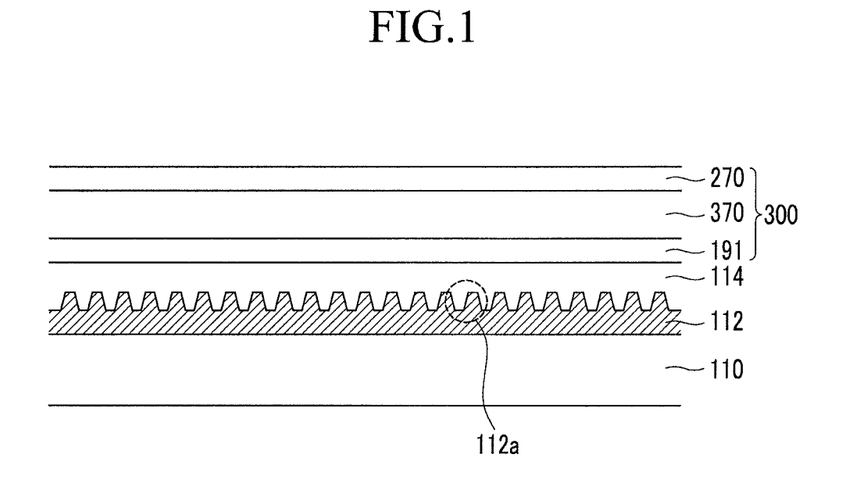
FIG. 1 is a schematic cross-sectional view of an organic light emitting diode (OLED) device according to one embodiment.

FIG. 1 is a cross-sectional view of an OLED device according to one embodiment. A first thin film (or a first layer) 112 is formed on an insulation substrate 110 made of, for example, transparent glass or plastic. In one embodiment, the first thin film 112 has alternately formed protrusions and depressions (or convex and concave portions) 112a. The protrusions and depressions may be irregularly distributed at the surface. In one embodiment, the protrusions and depressions 112a is a photocrystal member having a nano-sized pattern having a height of about 10 nm to about 2 μm. In this embodiment, the protrusions and depressions 112a decrease the total reflection of light in the inside and decrease the emitted light amount to the vertical direction from the substrate by controlling the light passage.

The first thin film 112 may be made of inorganic material or organic material having a refractive index of about 1.1 to about 3.0. The inorganic material may include, for example, silicon oxide ($SiO_2$), silicon nitride ($SiN_x$), or a combination thereof; the organic material may include, for example, polyacryl, polyimide, or a combination thereof. When the refractive index of the first thin film 112 is similar to the refractive index of the insulation substrate 110, it is possible to decrease the internal total reflection generated at the interface between the insulation substrate 110 and the first thin film 112.

A second thin film (or a second layer) 114 may be formed on the first thin film 112 to planarize the protrusions and depressions 112a of the first thin film 112. The second thin film 114 planarizes the protrusions and depressions 112a of the first thin film 112 to provide a plane emission layer. Therefore, it is possible to prevent that the emission layer is formed on the inclined surface of protrusions and depressions 112a in a less thickness. It is also possible to prevent that the current is concentrated in the inclined part in the case that the emission layer is formed along with the shape of protrusions and depressions 112a. As a result, the degeneration of the device is prevented and to the reliability is improved.

In one embodiment, the second thin film 114 has a refractive index of about 1.1 to about 3.0. In addition, when the refractive index of second thin film 114 is similar to the refractive index of first electrode 191, it is possible to decrease the total internal reflection generated at the interface between the second thin film 114 and the first electrode 191.

The second thin film 114 may be made of inorganic material or organic material having a refractive index different from that of the first thin film 112. The inorganic material may include, for example, silicon nitride ($SiN_x$), aluminum oxide ($Al_2O_3$), or a combination thereof; the organic material may include, for example, polyacryl, polyimide, or a combination thereof.

The refractive index difference between the first thin film 112 and the second thin film 114 may be at least about 0.2. For example, the first thin film 112 may have a refractive index of about 1.6 to about 2.2 and the second thin film 114 may have a refractive index of about 1.3 to about 1.6. Further, the first thin film 112 may have a refractive index of about 1.3 to about 1.6 and the second thin film 114 may have a refractive index of about 1.6 to about 2.2.

As in above, the total internal reflection is decreased and the extracted amount to the front surface is increased by providing protrusions and depressions at the interface between the first thin film 112 and the second thin film 114 having different refractive index. Accordingly, the light extracting efficiency may be increased.

A first electrode 191 is formed on the second thin film 114. The first electrode 191 may be either anode or cathode and may be made of a transparent conductive material such as ITO or IZO.

An organic light emitting member 370 is formed on the first electrode 191. The organic light emitting member 370 may have a multi-layer structure including an emission layer (not shown) and an auxiliary layer (not shown) for improving the luminous efficiency of emission layer.

The emission layer may be made of and organic material or a mixture of organic material and inorganic material inherently expressing one color light among primary colors of red, green, and blue. It may include aluminum tris(8-hydroxyquinoline), [Alq3], anthracene, distryl compound or a combination thereof. The organic light emitting diode (OLED) device expresses the desirable image by mixing of primary color lights generated from the emission layer.

The auxiliary layer may include one or at least two layers selected from the group consisting of an electron transport layer (ETL) (not shown) and hole transport layer (HTL) (not shown) for balancing electrons and holes; an electron injection layer (EIL) (not shown) and hole injection layer (HIL) (not shown) for enforcing the injection of electrons and holes.

A second electrode 270 is formed on the organic light emitting member 370. When the first electrode 191 is made of a transparent conductive material, the second electrode 270 may be made of opaque conductive material such as aluminum (Al), calcium (Ca) barium (Ba), or a combination thereof.

The first electrode 191 may be an anode, and the second electrode 270 may be a cathode; on the other hand, the first electrode 191 may be a cathode, and the second electrode 270 may be an anode.

As described above, the OLED device according to one embodiment limits the light passage to increase the light extracting effect to the vertical direction of substrate and to increase the light amount emitted to the outside among light generated from the emission layer. Thereby, it is possible to increase the luminous efficiency and the life-span of device, and simultaneously to decrease the driving voltage of the OLED device.

Hereinafter, the method of manufacturing the OLED device shown in FIG. 1 is described with reference to FIG. 2A to FIG. 2D together with FIG. 1.

FIG. 2A to FIG. 2D is cross sectional views sequentially showing the method of manufacturing the OLED device according to one embodiment. In one embodiment, the OLED is manufactured as follows.

Figure 2A:
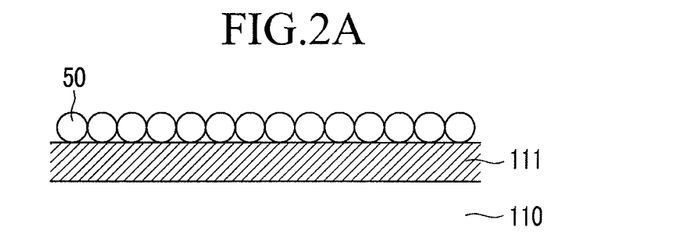
FIG. 2A to FIG. 2D are cross-sectional views sequentially showing a method of manufacturing the OLED device according to one embodiment.

First, as shown in FIG. 2A, a lower layer 111 is formed on the substrate 110. The lower layer 111 may use, for example, the substrate 110 without any further treatment, or it may be formed of, for example, silicon oxide, silicon nitride in accordance with plasma enhanced chemical vapor deposition (PECVD).

Then a dispersing solution (not shown) including a plurality of organic particulate 50 are coated on the lower layer 111. The dispersing solution may be, for example, a suspension that the organic particles 50 are mixed into a dispersing solvent such as water. The coating may be performed by, for example, spin coating.

In one embodiment, the organic particles 50 have a sphere shape made of organic material, for example, polystyrene. Each or at least one of the organic particles (or the first organic particles) 50 may have a size of about 0.03 µm to about 3.2 µm. In one embodiment, the dispersing solution is dried to remove the solvent and to provide an organic particles 50.

Figure 2B:
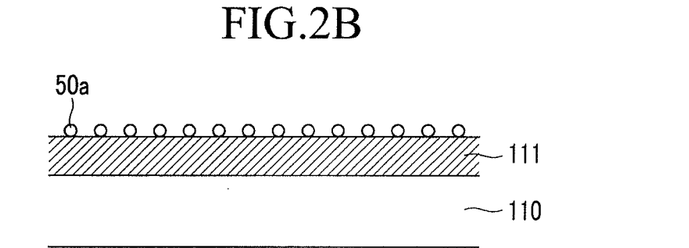

As shown in FIG. 2B, the organic particles 50 are etched using, for example, oxygen plasma to provide etched organic particles (or second organic particles) 50a having a smaller size than the organic particles 50. Each or at least one of the etched organic particles 50a may have a size of about 0.01 µm to about 2.0 µm.

Figure 2C:
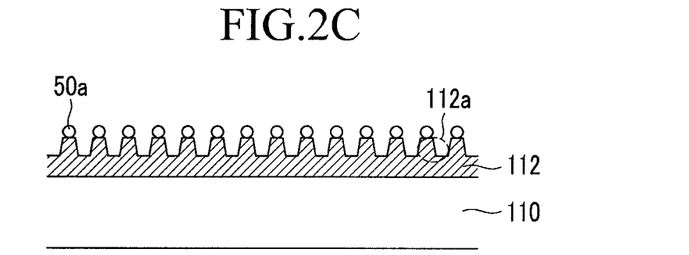

Referring to FIG. 2C, the lower layer 111 is etched using the etched organic particles 50a as a mask. The etching may be performed by reactive ion etching (RIE), and it may use, for example, $CHF_3$, $CF_4$ plasma. As a result of etching process, a first thin film 112 having a plurality of protrusions and depressions 112a is provided as shown in FIG. 2C.

Figure 2D:
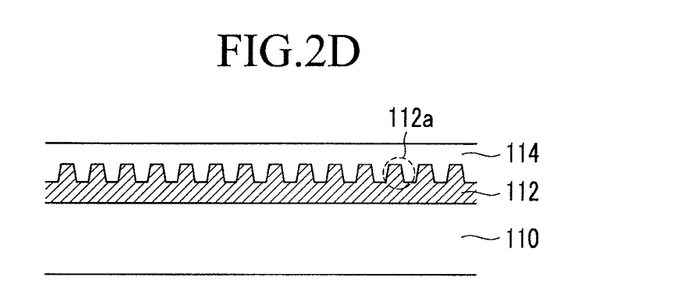

Then the etched organic particles 50a are removed, and a second thin film 114 is formed on the first thin film 112. The second thin film 114 may be formed of, for example, silicon nitride, aluminum oxide in accordance with plasma enhanced chemical vapor deposition (PECVD).

Referring back to FIG. 1, the first electrode 191, the organic light emitting member 370, and the second electrode 270 are sequentially formed on the second thin film 114.

According to one embodiment, the protrusions and depressions 112a may be easily provided by coating and etching process. Accordingly, it may be easily applied for a large size OLED device, so it is possible to overcome the limits that it cannot apply for the large area when using laser.

Hereinafter, the method of manufacturing an OLED device according to another embodiment is described. As in the aforementioned embodiment, the lower layer 111 is formed on the substrate 110. The lower layer 111 may be made of an organic material. The lower layer 111 made of organic material may be cured by heating in an oven or on a heating plate after spin coating.

In one embodiment, the surface of the lower layer 111 made of organic material is treated with plasma to provide a rough surface. The plasma may use, for example, argon (Ar) plasma. By treating the surface of the lower layer 111 made of organic material with plasma, it is possible to relatively easily provide the protrusions and depressions 112a. Therefore, the luminous efficiency is increased due to the protrusions and depressions 112a.

Hereinafter, the method of manufacturing an OLED device according to further another embodiment is described. As in the aforementioned embodiment, the lower layer 111 is formed and treated with plasma to provide the protrusions and depressions 112a. However, differing from the aforementioned embodiment, a metal cluster is applied on the lower layer 111. Then the lower layer 111 is treated with plasma using the metal cluster as a mask to provide the first thin film 112 having the protrusions and depressions 112a at the surface.

The following examples illustrate this disclosure in more detail. These examples, however, are not in any sense be interpreted as limiting the scope of this disclosure.

EXAMPLE 1

10 g of sphere polystyrene particles having an average diameter of 0.6 µm was dispersed in 100 ml of water to provide a suspension.

A silicon oxide ($SiO_2$) was deposited on a glass substrate in 0.5 µm in accordance with a chemical vapor deposition (CVD) method. Then the suspension was spin-coated on the silicon oxide layer in 800 rpm. The suspension was dried at a temperature of 25° C. to remove the solvent. The substrate was introduced in a plasma chamber and supplied with oxygen gas (O₂) and argon gas (Ar) to plasma-etch the polystyrene particles. Oxygen gas (O₂) and argon gas (Ar) were supplied in a flowing amount of 2 sccm and 5 sccm, respectively, and RF (radio frequency) was 200 W. By the plasma etch, the size of polystyrene particles was decreased into about 0.3 μm. The silicon oxide layer was dry-etched with using the etched polystyrene particles as a mask. The dry etching was performed using CHF₃ in aninductive coupled plasma (ICP) etching device. The CHF₃ was supplied in a flowing amount of 20 sccm; the chamber pressure was 50 mT; the ICP output was 500 W; and it was repeated for three times for each 2 minutes. Then the remaining polystyrene particles were removed by supplying oxygen gas (O₂) and argon gas (Ar) in a room pressure plasma chamber.

Figure 4:
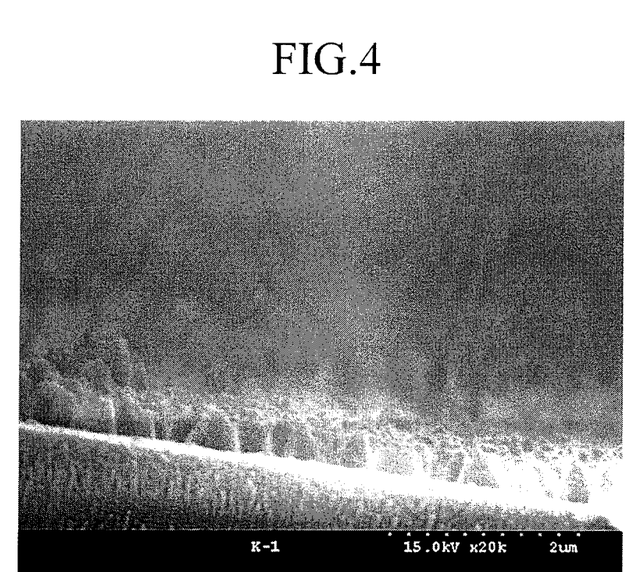
FIG. 4 is a photograph of scanning electron microscope (SEM) showing protrusions and depressions after removing polystyrene particulate in Example 1.

FIG. 4 is a photograph of scanning electron microscope (SEM) showing protrusions and depressions of SiO₂ after removing polystyrene particles. Then silicon nitride was deposited on the etched silicon oxide layer in 5000 Å in accordance with chemical vapor deposition (CVD) and planarized.

Figure 5:
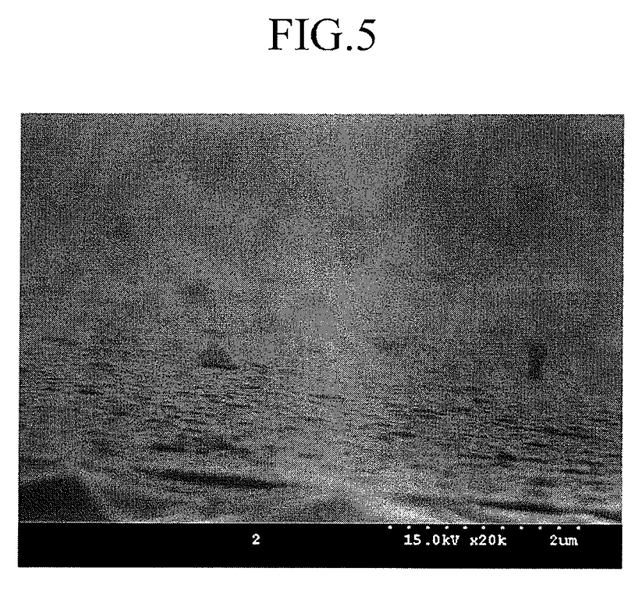
FIG. 5 is a SEM photograph showing a planarized surface after depositing silicon nitride in Example 1.

FIG. 5 is a scanning electron microscope (SEM) photograph showing the planarized surface after depositing silicon nitride. Then ITO was sputtered on the silicon nitride layer and patterned. N,N-dinaphthalene-1-yl-N,N-diphenyl-benzidine (NPB) was deposited as a hole injection layer (HIL) and a hole transport layer, and an emission layer of tris-8-hydroxyquinoline aluminum (Alq3) doped with coumarin 6 in 1 wt % was co-deposited thereon. Then an electron transport layer of Alq3 was deposited thereon, and a LiF electron injection layer (EIL) for facilitating the implant of electron and Al anode were sequentially deposited to provide an organic light emitting element.

EXAMPLE 2

Polyacryl was spin-coated on a glass substrate in 2.0 μm and dried. Then a substrate was introduced into a plasma chamber and supplied with argon gas (Ar) and nitrogen gas (N2) to perform a plasma etching. The plasma etching was performed under the condition of flowing amount of argon gas (Ar) in 40 sccm and nitrogen gas (N2) in 3 sccm; a chamber pressure of 200 mT; ICP output of 400 W; and an etching time of 5 minutes. The roughness of the surface of organic layer after the etching was measured by an atomic force microscopy (AFM).

Figure 3:
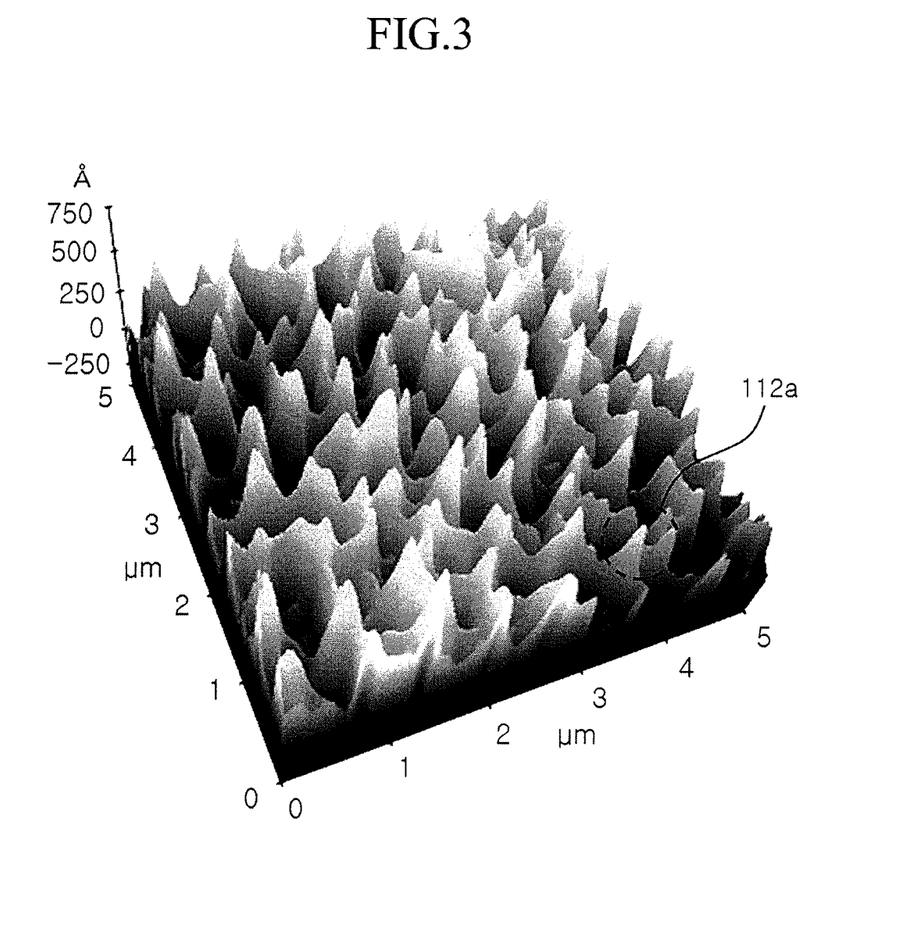
FIG. 3 is a photograph of atomic microscope showing protrusions and depressions of an OLED device according to another embodiment.

FIG. 3 is a photograph of atom microscope showing protrusions and depressions of an OLED device obtained from another embodiment. Referring to FIG. 3, it is confirmed that protrusions and depressions 112a had a height of about 200 to about 500 Å and were irregularly distributed on the entire surface of substrate. Then similarly to Example 1, a silicon nitride layer, ITO, an emission layer, and silver were sequentially laminated to provide an organic light emitting element.

EXAMPLE 3

Silicon oxide (SiO2) was laminated on a glass substrate in 0.5 μm in accordance with a chemical vapor deposition (CVD) method. Then a Ni layer was deposited on the silicon oxide layer in a thickness of 5 nm using an electron beam depositor. A substrate was introduced in a rapid thermal annealing (RTA) device and treated at 850° C. for one minute to provide a nano-sized Ni cluster. A silicon oxide layer was etched by a reactive ion etching (RIE) using the Ni cluster as a mask. Then the Ni cluster was removed using a nitric acid solution. Then similarly to Example 1, a silicon nitride layer, ITO, an emission layer, and silver were sequentially laminated to provide an organic light emitting element.

According to at least one embodiment, since the protrusions and depressions are formed where light generated from the emission layer passes, the light extracting efficiency in the vertical dimension of the substrate increases. Furthermore, the amount of light emitted to the environment increases. Thereby, the luminous efficiency is improved, and the lifespan of the device is lengthened. Simultaneously, the driving voltage of an organic light emitting diode (OLED) device may be decreased. In addition, since the protrusions and depressions may be formed by a wet process such as spin-coating or a dry process such as plasma etching, it is possible to be applied for a large size display device.

While this disclosure has been described in connection with what is presently considered to be practical exemplary embodiments, it is to be understood that this disclosure is not limited to the disclosed embodiments, but, on the contrary, is intended to cover various modifications and equivalent arrangements included within the spirit and scope of the appended claims.

What is claimed is:

1. An organic light emitting diode (OLED) device comprising:
    a substrate;
    a first thin film formed on the substrate, wherein the first thin film comprises first and second surfaces opposing each other, wherein the first surface contacts the substrate, wherein a plurality of protrusions and depressions are alternately and continuously formed on the second surface of the first thin film, wherein the protrusions and depressions have a height of about 200 to 500 Angstrom, wherein the protrusions and depressions are irregularly distributed, and wherein each of the protrusions has a substantially trapezoidal shape formed on the second surface of the first thin film, and wherein the first thin film is formed of silicon oxide, silicon nitride, polyacryl, polyimide, or a combination thereof;
    a second thin film formed on the protrusions and depressions of the first thin film, and wherein the second thin film is formed of silicon nitride, aluminum oxide, or a combination thereof;
    a first electrode formed on the second thin film;
    an organic light emitting member formed on the first electrode; and
    a second electrode formed on the organic light emitting member.

2. The OLED device of claim 1, wherein the first thin film and the second thin film have different refractive indexes.

3. The OLED device of claim 1, wherein each of the first thin film and the second thin film has a refractive index of about 1.1 to about 3.

4. The OLED device of claim 3, wherein the refractive indexes of the first thin film and second thin film differ by at least about 0.2.

5. The OLED device of claim 1, wherein the first thin film has a refractive index of about 1.6 to about 2.2, and wherein the second thin film has a refractive index of about 1.3 to about 1.6.

6. The OLED device of claim 1, wherein the first thin film has a refractive index of about 1.3 to about 1.6, and wherein the second thin film has a refractive index of about 1.6 to about 2.2.

7. A method of manufacturing an organic light emitting diode (OLED) device comprising:
    providing a first thin film on a substrate, wherein the first thin film comprises first and second surfaces opposing each other, wherein the first surface contacts the substrate, wherein the second surface of the first thin film has a plurality of protrusions and depressions which are alternately and continuously formed with respect to each other, wherein the protrusions and depressions are irregularly distributed, wherein the protrusions and depressions have a height of about 200 to 500 Angstrom, and wherein each of the protrusions has a substantially trapezoidal shape formed on the second surface of the first thin film, and wherein the first thin film is formed of silicon oxide, silicon nitride, polyacryl, polyimide, or a combination thereof providing a second thin film on the second surface of the first thin film so as to planarize the protrusions and depressions, and wherein the second thin film is formed of silicon nitride, aluminum oxide, or a combination thereof;

providing a first electrode on the second thin film;

providing a light emitting member on the first electrode; and providing a second electrode on the light emitting member.

8. The method of claim 7, wherein the providing of the first thin film comprises:

forming the first thin film;

coating a dispersing solution on the first thin film, wherein the dispersing solution contains a plurality of first organic particles at least one of which has a first size;

drying the dispersing solution;

etching the first organic particles into a plurality of second organic particles at least one of which has a second size smaller than the first size; and etching the first thin film with the use of the second organic particles as a mask.

9. The method of claim 8, wherein the first and second organic particles have a sphere shape.

10. The method of claim 8, wherein the first and second organic particles contain polystyrene.

11. The method of claim 8, wherein the etching of the first organic particles is performed by plasma.

12. The method of claim 8, wherein the etching of the first thin film is performed by reactive ion etching.

13. The method of claim 7, wherein the providing of the first thin film comprises:

forming a first thin film containing an organic material; and treating the surface of the first thin film with plasma.

14. The method of claim 13, further comprising applying a metal cluster on the first thin film after laminating the first thin film; and wherein the plasma treating of the surface of the first thin film is performed with the use of the metal cluster as a mask.

15. An organic light emitting diode (OLED) device comprising:

a substrate;

a first layer formed on the substrate, wherein the first layer comprises first and second surfaces opposing each other, wherein the first surface contacts the substrate, wherein the second surface of the first layer has a plurality of convex and concave portions which are alternately and continuously formed with respect to each other, wherein the convex portions and concave portions are irregularly distributed, wherein the convex portions and concave portions have a height of about 200 to 500 Angstrom, and wherein each of the convex portions has a substantially trapezoidal shape formed on the second surface of the first layer, and wherein the first layer is formed of silicon oxide, silicon nitride, polyacryl, polyimide, or a combination thereof, a second layer formed on the convex and concave portions of the first layer; and wherein the second layer is formed of silicon nitride, aluminum oxide, or a combination thereof an organic light emitting diode formed on the second layer.

16. The OLED device of claim 15, wherein the first and second layers have different refractive indexes.

17. The OLED device of claim 16, wherein at least two of the convex and concave portions are not uniformly formed with respect to the remaining convex and concave portions.

18. The OLED device of claim 15, wherein the first layer is formed of silicon oxide, silicon nitride, polyacryl, polyimide, or a combination thereof, and wherein the second layer is formed of silicon nitride, aluminum oxide, or a combination thereof.

* * * * *